US012597567B2

(12) United States Patent
Demcko et al.

(10) Patent No.: US 12,597,567 B2
(45) Date of Patent: Apr. 7, 2026

(54) SINGLE LAYER CAPACITOR

(71) Applicant: KYOCERA AVX Components Corporation, Fountain Inn, SC (US)

(72) Inventors: Ronald S. Demcko, Raleigh, NC (US); Cory Nelson, Simpsonville, SC (US); Marianne Berolini, Greer, SC (US); Jeff Borgman, Myrtle Beach, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 244 days.

(21) Appl. No.: 18/489,039

(22) Filed: Oct. 18, 2023

(65) Prior Publication Data

US 2024/0136123 A1     Apr. 25, 2024
US 2024/0234038 A9     Jul. 11, 2024

Related U.S. Application Data

(60) Provisional application No. 63/418,107, filed on Oct. 21, 2022.

(51) Int. Cl.
| | |
|---|---|
| *H01G 4/33* | (2006.01) |
| *H01G 4/12* | (2006.01) |
| *H01G 4/252* | (2006.01) |
| *H05K 1/16* | (2006.01) |

(52) U.S. Cl.
CPC ............. *H01G 4/33* (2013.01); *H01G 4/1254* (2013.01); *H01G 4/252* (2013.01); *H05K 1/162* (2013.01); *H05K 2201/09554* (2013.01)

(58) Field of Classification Search
None
See application file for complete search history.

(56) References Cited

U.S. PATENT DOCUMENTS

| | | | | |
|---|---|---|---|---|
| 5,172,304 | A | * 12/1992 | Ozawa | ................... H05K 1/162 |
| | | | | 174/72 B |
| 5,390,072 | A | 2/1995 | Anderson et al. | |
| 5,731,747 | A | * 3/1998 | Van De Walle | ........ H01L 25/16 |
| | | | | 361/306.3 |
| 6,541,137 | B1 | * 4/2003 | Kingon | ................ H01G 4/1218 |
| | | | | 338/226 |
| 6,910,264 | B2 | * 6/2005 | Tung | ...................... H05K 1/162 |
| | | | | 29/830 |
| 7,571,536 | B2 | 8/2009 | McGregor | |
| 7,813,141 | B2 | * 10/2010 | Borland | ................. H05K 1/162 |
| | | | | 361/761 |
| 8,039,759 | B2 | 10/2011 | Lee et al. | |
| 8,830,691 | B2 | 9/2014 | Inagaki et al. | |
| 9,941,054 | B2 | 4/2018 | Sankman et al. | |

(Continued)

OTHER PUBLICATIONS

International Search Report and Written Opinion for PCT/US2023/035400 dated Feb. 7, 2024, 9 pages.

*Primary Examiner* — Dion R. Ferguson
(74) *Attorney, Agent, or Firm* — Dority & Manning, P.A.

(57) ABSTRACT

A single layer capacitor can include a substrate having a first surface and a second surface opposite the first surface. A resistive layer can be formed over at least a portion of the first surface of the substrate. A first conductive layer can be formed over at least a portion of the resistive layer. A second conductive layer can be formed over at least a portion of the second surface of the substrate. As such, the single layer capacitor can include a resistor and a capacitor formed in series with one another.

20 Claims, 8 Drawing Sheets

(56)  References Cited

U.S. PATENT DOCUMENTS

| | | | | |
|---|---|---|---|---|
| 10,957,807 | B2 | 3/2021 | Kotru et al. | |
| 12,200,853 | B2 * | 1/2025 | Nelson | H05K 1/021 |
| 2002/0179329 | A1 * | 12/2002 | Fukuoka | H05K 1/162 |
| | | | | 174/250 |
| 2004/0128822 | A1 * | 7/2004 | Tung | H05K 1/167 |
| | | | | 29/592.1 |
| 2008/0297274 | A1 * | 12/2008 | Borland | H05K 1/167 |
| | | | | 29/25.42 |
| 2014/0076492 | A1 | 3/2014 | Lai et al. | |
| 2015/0351247 | A1 * | 12/2015 | Kwon | H01L 23/5389 |
| | | | | 29/841 |
| 2020/0402720 | A1 | 12/2020 | Marin et al. | |
| 2021/0066265 | A1 | 3/2021 | Eid et al. | |
| 2022/0346222 | A1 * | 10/2022 | Nelson | H05K 1/185 |
| 2022/0367732 | A1 | 11/2022 | Nelson et al. | |
| 2022/0367733 | A1 | 11/2022 | Nelson et al. | |
| 2022/0418081 | A1 * | 12/2022 | Nelson | H05K 3/0047 |
| 2024/0136448 | A1 * | 4/2024 | Demcko | H10D 1/66 |
| 2024/0234038 | A9 * | 7/2024 | Demcko | H01G 4/33 |

* cited by examiner

SINGLE LAYER CAPACITOR

RELATED APPLICATION

The present application is based upon and claims priority to U.S. Provisional Patent Application Ser. No. 63/418,107, having a filing date of Oct. 21, 2022, which is incorporated herein by reference.

BACKGROUND OF THE INVENTION

Single layer capacitors (SLCs) provide a variety of benefits, such as temperature stability, generally high breakdown voltages, and low leakage currents. Generally, however, the frequency response of SLCs can limit their end applications. Increasing the equivalent series resistance (ESR) could expand the application of SLCs.

SUMMARY OF THE INVENTION

In accordance with one embodiment of the present disclosure, a single layer capacitor can include a substrate having a first surface and a second surface opposite the first surface. A resistive layer can be formed over at least a portion of the first surface of the substrate. A first conductive layer can be formed over at least a portion of the resistive layer. A second conductive layer can be formed over at least a portion of the second surface of the substrate.

In accordance with another embodiment of the present disclosure, a method for forming a single layer capacitor can include depositing a resistive layer over at least a portion of a first surface of a substrate; depositing a first conductive layer over at least a portion of the resistive layer; and depositing a second conductive layer over at least a portion of a second surface of the substrate, the second surface opposite the first surface.

In accordance with another embodiment of the present disclosure, an embedded capacitor assembly can include a circuit board substrate having a mounting surface and a single layer capacitor at least partially embedded within the circuit board substrate. The single layer capacitor can include a substrate having a first surface opposite a second surface, a resistive layer formed over at least a portion of the first surface, a first conductive layer formed over at least a portion of the resistive layer, and a second conductive layer formed over at least a portion of the second surface.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which.

Figure 1A:
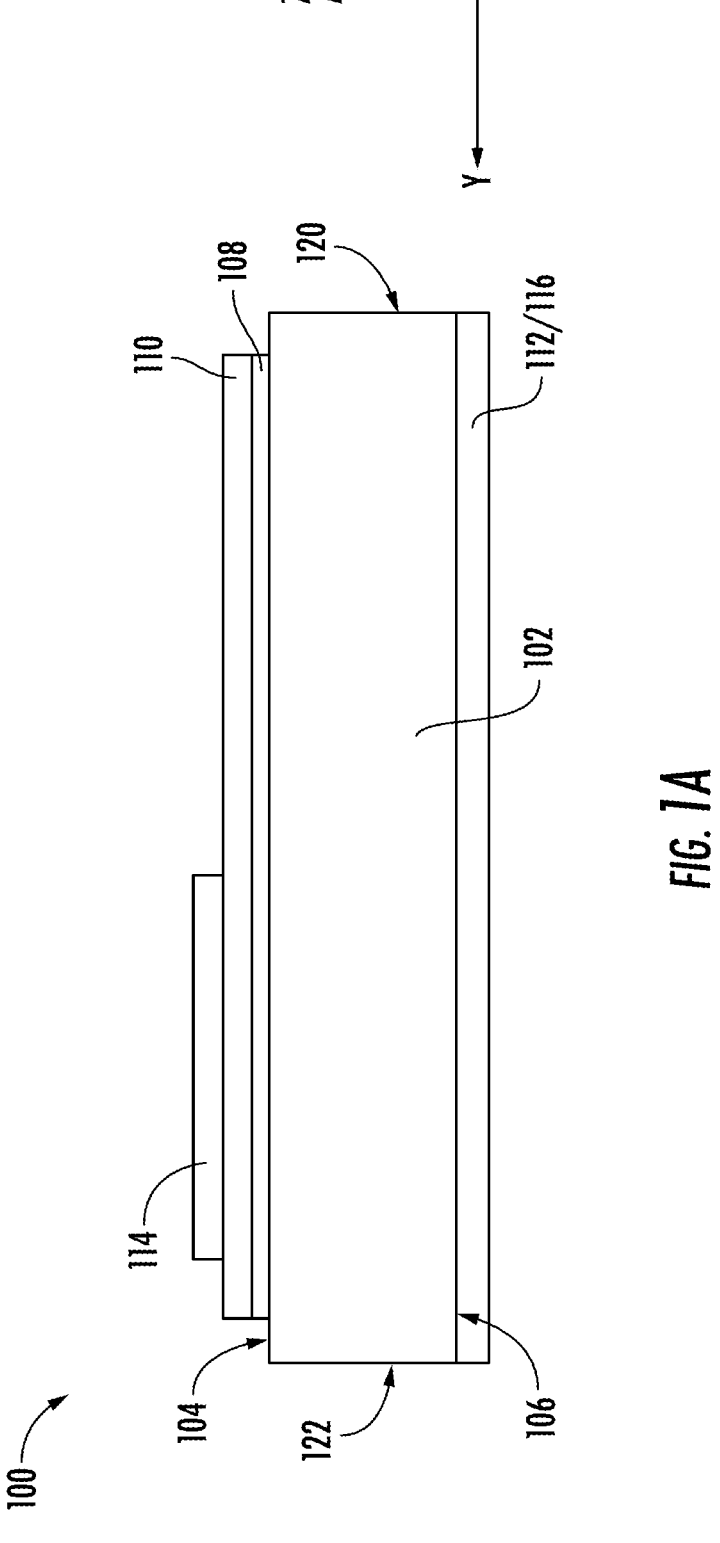
FIG. 1A is a side view of a capacitor according to aspects of the present disclosure.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only and is not intended as limiting the broader aspects of the present invention, which broader aspects are embodied in the exemplary construction.

Generally speaking, the present invention is directed to a single layer capacitor having a resistive layer. For example, the single layer capacitor (SLC or "capacitor" as used herein) can include a substrate, a resistive layer formed over at least a portion of a first surface of the substrate, a first conductive layer formed over at least a portion of the resistive layer, and a second conductive layer formed over at least a portion of a second surface of the substrate that is opposite the first surface of the substrate.

An effective circuit formed by the capacitor having the resistive layer is a resistor in line with a capacitor, which can render the capacitor a higher equivalent series resistance (ESR) capacitor. Increased ESR can reduce the Q factor, or quality factor, of the capacitor and broaden the frequency response of the capacitor. A broadened frequency response of an SLC can improve the performance of bias lines in active radiofrequency (RF) devices, e.g., by providing filtered voltage to the active RF device. It will be appreciated that the quality factor or Q factor is the reactance of the capacitor divided by the ESR of the capacitor.

Additionally, or alternatively, a broadened frequency response due to increased ESR can enhance the performance of SLCs in RF shunt applications and noise filtering applications. For example, a bias bank of RF active devices utilizing one or more SLCs as described herein can have a reduced number of components, e.g., compared to a bias bank that does not utilize SLCs having a resistive layer as described herein. A reduced number of components in the bias bank can increase reliability, reduce size, and improve active device performance of the bias bank. Other applications may include VCO, mixers, and cascade amplifiers voltage supply.

Further, a reduced Q factor of the capacitor can increase its frequency range, as well as the usefulness of the capacitor in broadband applications. A reduced Q factor also promotes miniaturization of the capacitor.

As stated, the single layer capacitor can include a substrate and a resistive layer formed over the substrate. In some embodiments, the substrate may be formed from a material having a dielectric constant (K) that is less than about 30 as determined in accordance with ASTM D2520-13 at an operating temperature of 25° C. and frequency of 500 MHz, in some embodiments less than about 25, in some embodiments less than about 20, and in some embodiments less than about 15. However, in other embodiments, a material having a dielectric constant higher than 30 may be used to achieve higher frequencies and/or smaller components. For example, in such embodiments, the dielectric constant may range from about 30 to about 120, or greater as determined in accordance with ASTM D2520-13 at an operating temperature of 25° C. and frequency of 500 MHz, in some embodiments from about 50 to about 100, and in some embodiments from about 70 to about 90.

In still other embodiments, the substrate may be formed from a material having a relatively high dielectric constant (K), such as from about 10 to about 40,000 in some embodiments from about 50 to about 30,000, and in some embodiments, from about 100 to about 20,000.

The substrate may comprise one or more suitable ceramic materials. Suitable materials are generally electrically insulating and thermally conductive. For example, in some embodiments, the substrate may include sapphire, ruby, alumina ($Al_2O_3$), aluminum nitride (AlN), beryllium oxide (BeO), aluminum oxide ($Al_2O_3$), boron nitride (BN), silicon (Si), silicon carbide (SiC), silica ($SiO_2$), silicon nitride ($Si_3N_4$), gallium arsenide (GaAs), gallium nitride (GaN), zirconium dioxide ($ZrO_2$), mixtures thereof, oxides and/or nitrides of such materials, or any other suitable ceramic material. Additional example ceramic materials include barium titanate ($BaTiO_3$), calcium titanate ($CaTiO_3$), zinc oxide (ZnO), ceramics containing low-fire glass, or other glass-bonded materials.

Particular examples of the type of high dielectric material include, for instance, NPO (COG) (up to about 100), X7R (from about 3,000 to about 7,000), X7S, ZSU, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a perovskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric material may comprise a titanate.

As used herein, a layer that is "formed over" an object can include the layer being directly formed on the object and the layer being formed over one or more intermediate layers that are between the layer and the object. Further, formed "over" a bottom surface refers to outward from a center of the component.

The resistive layer of the capacitor can be formed over at least a portion of a surface of the substrate. In some embodiments, the resistive layer may be a thin-film resistor.

The thin-film resistor may be configured to exhibit a variety of resistance values, as desired. For example, in some embodiments the thin-film resistor may have a resistance that ranges from about 1Ω to about 2,000Ω, in some embodiments from about 2Ω to about 1,000Ω, in some embodiments from about 5Ω to about 750Ω, in some embodiments from about 10Ω to about 500Ω, in some embodiments from about 25Ω to about 400Ω.

The resistive layer of the thin-film resistor may be formed using a variety of thin film techniques as further described herein. The resistive layer of the thin-film resistor may be formed from a variety of suitable resistive materials. For example, the resistive layer may include tantalum nitride (TaN), silicon chromium (SiCr), nickel chromium (NiCr), tantalum aluminide, chromium silicon, titanium nitride, titanium tungsten, tantalum tungsten, oxides and/or nitrides of such materials, and/or any other suitable thin film resistive materials.

The first conductive layer of the capacitor can be formed over at least a portion of the resistive layer. The first conductive layer can be contained within a perimeter of the resistive layer. The first conductive layer can be free of direct contact and/or direct electrical connection with the substrate.

The capacitor can also include an additional or a second conductive layer. The second conductive layer can be formed over a surface of the substrate opposite the resistive layer. For example, the substrate may have a first surface and a second surface opposite the first surface, and the resistive layer may be formed over the first surface and the second conductive layer may be formed over the second surface.

The conductive layers may be formed from any of a variety of different metals as is known in the art. The electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel, and gold, may also be suitable. The electrodes may also be made of a low resistive material, such as silver, copper, gold, aluminum, palladium, etc. In one particular embodiment, the electrode layers may comprise nickel or an alloy thereof.

The capacitor can include a pair of terminals, referred to individually as a first terminal and a second terminal. The first terminal can be connected with the first conductive layer, or the first terminal can be connected with the first surface of the substrate. The second terminal can be connected with the second surface of the substrate (opposite the surface on which the resistive layer is formed), or the second terminal can be connected with the second conductive layer. As used herein "connected with" can refer to components that are in direct physical contact. "Connected with" can also refer to items that are physically connected by one or intermediate conductive layers such that the items are in direct electrical connection (e.g., without a resistive layer or dielectric layer therebetween). For instance, as described herein, the first terminal can be formed over the first conductive layer, and the second terminal can be formed over the second surface of the substrate, with or without the second conductive layer between the second terminal and the second surface.

In some embodiments, the first conductive layer and/or the second conductive layer can be one terminal of the pair of terminals. That is, rather than a separate first terminal that is in addition to the first conductive layer and/or a separate second terminal that is in addition to the second conductive layer, the first conductive layer can form the first terminal and/or the second conductive layer can form the second terminal.

Thus, in some embodiments, the first terminal can include an electrically conductive material that directly contacts the first surface of the substrate, and in other embodiments, the first terminal can include an electrically conductive material that directly contacts a first conductive layer that is formed over the first surface of the substrate. Similarly, in some embodiments, the second terminal can include an electrically conductive material that directly contacts the second surface of the substrate, and in other embodiments, the second terminal can include an electrically conductive material that directly contacts a second conductive layer that is formed over the second surface of the substrate.

One or more protective layers can be formed over the substrate. For example, one or more protective layers can be formed over the first surface and/or the second surface of the substrate. In some embodiments, the first terminal and/or second terminal can be exposed through the one or more protective layers for electrical connection. Example materials for the protective layer(s) include benzocyclobutene (BCB), polyimide, silicon oxynitride, alumina (Al2O3), silica (SiO2), silicon nitride (Si3N4), epoxy, glass, or another suitable material.

Various thin-film techniques can be used to form thin-film layers of the capacitor. For instance, one or more of the first conductive layer, the second conductive layer, the resistive layer, and the terminals may be thin-film layers of the capacitor. Examples of such techniques that may be employed include chemical deposition (e.g., chemical vapor deposition), PECVD (Plasma Enhanced Chemical Vapor Deposition) processing, physical deposition (e.g., sputtering), or any other suitable deposition technique for forming thin-film elements. Additional examples include any suitable patterning technique (e.g., photolithography), etching, and any other suitable subtractive technique for forming thin-film elements.

The thin-film layers can have a range of thicknesses. For example, the thin-film layers can have thicknesses that can range in some embodiments from about 0.001 micrometers (microns) to about 100 microns, in some embodiments from about 0.0375 microns to about 40 microns, in some embodiments from about 0.1 microns to about 30 microns, in some embodiments from about 0.2 microns to about 20 microns in some embodiments from about 0.4 microns to about 10 microns. For instance, in some embodiments, the resistive layer may have a thickness less than about 10 microns, in some embodiments less than about 8 microns, in some embodiments less than about 6 microns, and in some embodiments less than about 4 microns.

In some embodiments, the conductive layer formed over the resistive layer may be relatively small compared to the resistive layer, which defines the capacitive area. By providing a relatively small conductive layer, only a relatively small area is available for current to flow through, which forces the current through the resistive layer and can increase resistance from the edges of the resistive layer to the relatively small conductive layer.

The relative size of the conductive layer compared to the resistive layer can be defined by a ratio of an area of the resistive layer to an area of the conductive layer. The area of the resistive layer can be defined by a length of the resistive layer that extends in the Y-direction and a width of the resistive layer that extends in the X-direction. Similarly, the area of the conductive layer can be defined by a length of the conductive layer that extends in the Y-direction and a width of the conductive layer that extends in the X-direction. In some embodiments, the ratio of the area of the resistive layer to the area of the conductive layer may be within a range of about 100:1, in some embodiments within a range of about 75:1, in some embodiments within a range of about 50:1, in some embodiments within a range of about 25:1, in some embodiments within a range of about 15:1, in some embodiments within a range of about 10:1, in some embodiments within a range of about 5:1, in some embodiments within a range of about 3:1, and in some embodiments within a range of about 1.5:1.

In some aspects of the present subject matter, the capacitor can be configured for being embedded within a circuit board substrate, such as a printed circuit board. For example, the first terminal and the second terminal can be exposed along opposite surfaces of the substrate, such as a top surface and a bottom surface of the substrate, and can be contained within a perimeter of the respective surface of the substrate.

The present subject matter is further directed to an embedded capacitor assembly including a circuit board substrate, such as a printed circuit board, having a capacitor at least partially embedded therein. The circuit board substrate can be formed from any suitable material, such as FR4, polytetrafluoroethylene, or the like. One or more electronic components, such as capacitors, resistors, transistors, switches, and/or other electronic components can be mounted to the circuit board substrate. As used herein, "mounted to" the circuit board can include any type of connection to the circuit board substrate that provides electrical connectivity, such as surface mounting to a surface of the circuit board substrate, embedding within the circuit board substrate, or the like.

The circuit board substrate can have a recessed opening in a mounting surface of the circuit board substrate, such as an upper surface or a lower surface. The recessed opening can be configured to receive an electric component to be embedded within the circuit board substrate. For instance, a capacitor, such as the capacitors described herein, can be inserted within the recessed opening for embedding within the circuit board substrate. One or more electrically conductive terminations of the capacitor can be coupled to the circuit board substrate. For instance, one or more vias can be formed in, on, or through the terminations to electrically connect the capacitor with one or more conductive traces of the circuit board substrate and/or one or more electronic components that are mounted to the circuit board substrate.

The first and second terminals of the capacitor can be formed from copper, such as by copper plating. Typically, solid copper may not be a suitable material for forming exposed terminations of an electronic component because copper is susceptible to oxidizing when exposed. As such, solder material such as an alloy of copper, tin, and gold, is often used to form electrical terminations for electronic components such as capacitors. However, the present inventors have found that forming the first and second terminals of the embeddable capacitor from copper, e.g., by plating solid copper over a conductive layer and/or over one or more surfaces of the substrate, can provide superior electrical connections without the risk of oxidizing when the capacitor is embedded within a circuit board substrate. For instance, the first and second terminals can be laser drilled to form direct electrical connections with the circuit board substrate and/or additional electronic components mounted to the circuit board substrate.

Figure 1B:
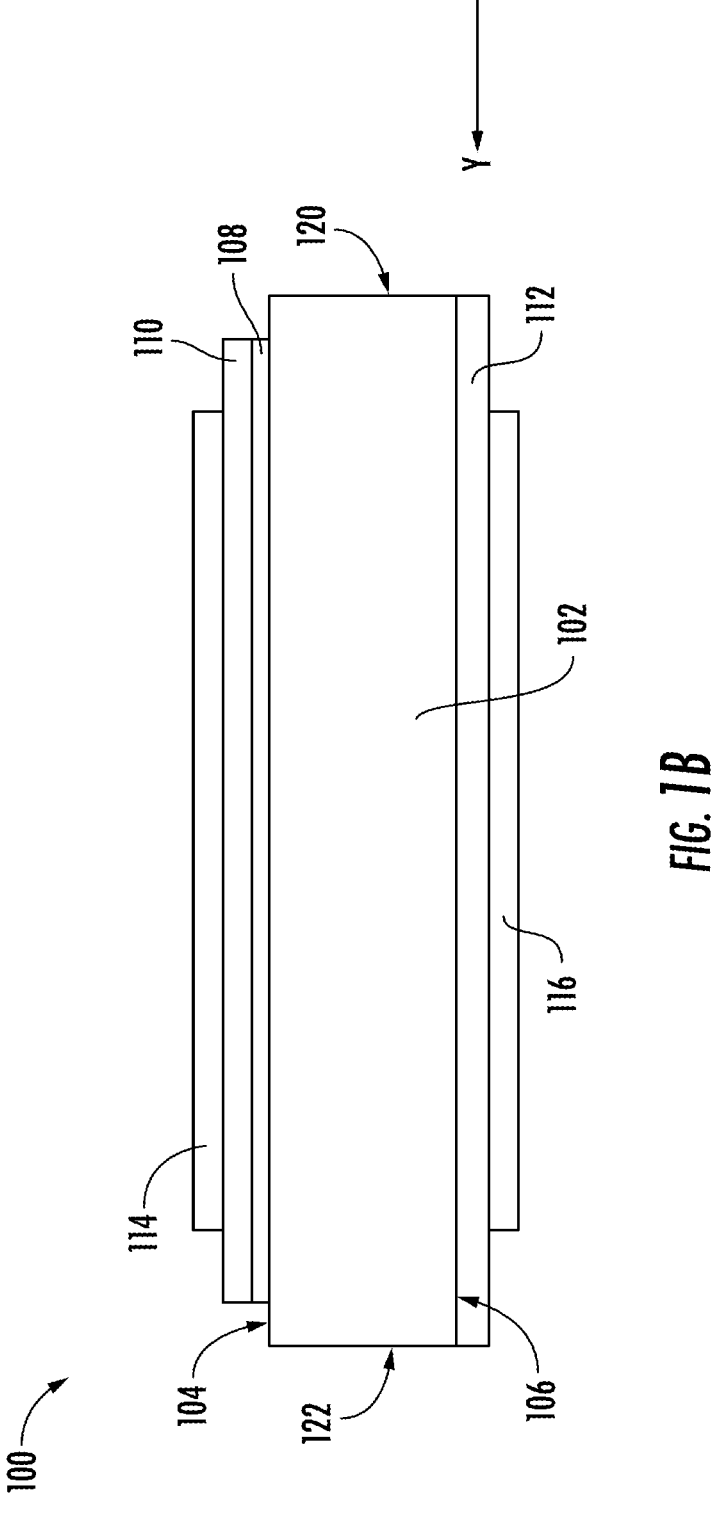
FIG. 1B is a side view of another capacitor according to aspects of the present disclosure.
Figure 1C:
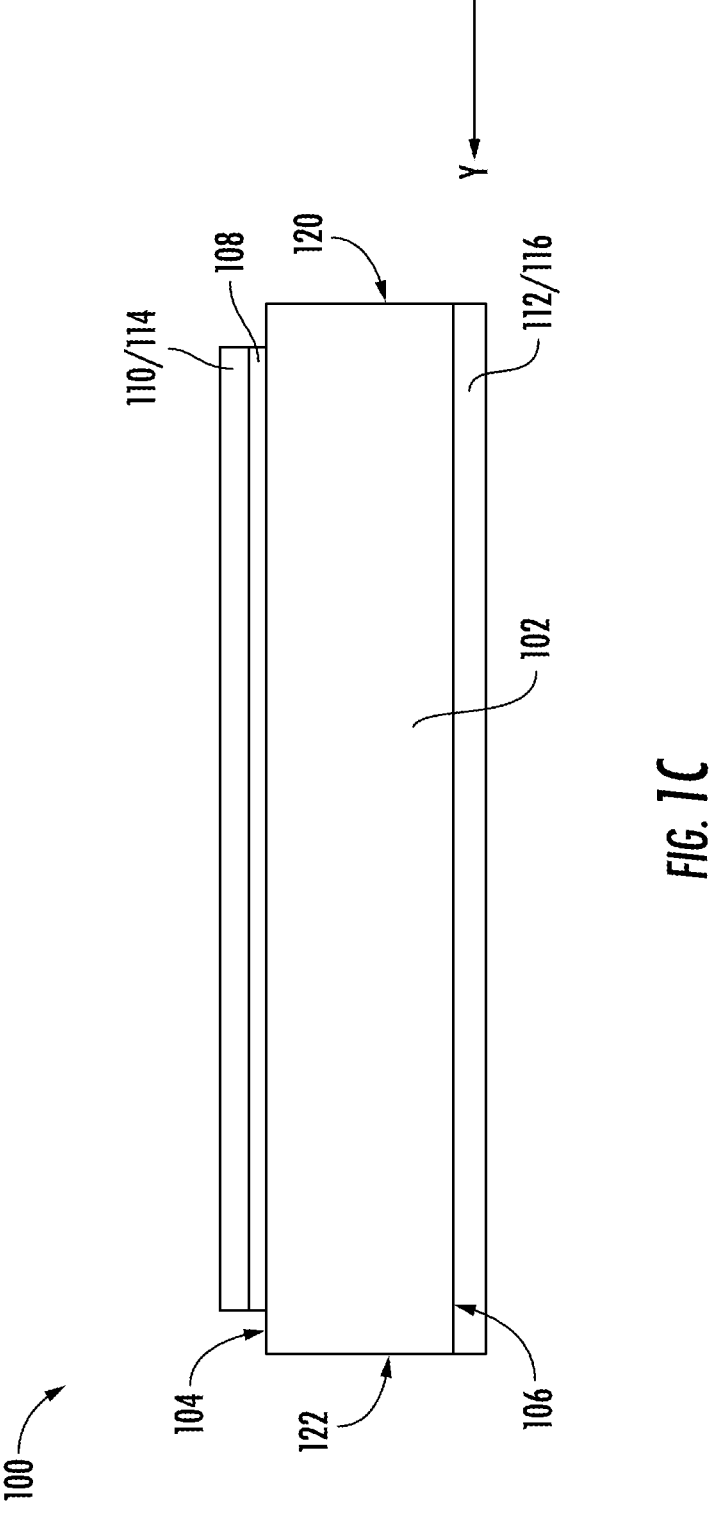
FIG. 1C is a side view of still another capacitor according to aspects of the present disclosure.

FIG. 1A is a side view of a single layer capacitor 100 according to aspects of the present disclosure. The single layer capacitor 100 may also be referred to herein as SLC 100 or capacitor 100. FIGS. 1B and 1C are side views of the capacitor 100 according to other aspects of the present disclosure.

As shown in FIGS. 1A, 1B, and 1C, the capacitor 100 can include a substrate 102 having a first surface 104 and a second surface 106 opposite the first surface 104. The substrate 102 can be formed from a dielectric material. In some embodiments, the dielectric material may have a relatively low dielectric constant (K), but in other embodiments, the dielectric material may have a relatively high dielectric constant.

The capacitor 100 can include a resistive layer 108 formed over at least a portion of the first surface 104 of the substrate 102. In some embodiments, the resistive layer 108 can have a thickness less than about 10 microns. In some embodiments, the resistive layer 108 can be formed from tantalum nitride (TaN), and in other embodiments, the resistive layer 108 can be formed from chromium silicon (CrSi). The resistive layer 108 can have other thicknesses and/or be formed from other materials as described elsewhere herein.

The capacitor 100 can further include a first conductive layer 110 formed over at least a portion of the resistive layer 108. The first conductive layer 110 can be contained within a perimeter of the resistive layer 108. The first conductive layer 110 can be free of direct contact and/or direct electrical connection with the substrate 102.

The capacitor 100 can also include a second conductive layer 112 formed over the second surface 106 of the substrate 102. The second conductive layer 112 can extend over the entirety of the second surface 106 as shown in FIGS. 1A, 1B, and 1C. Alternatively, the second conductive layer 112 could be offset from one or more edges of the substrate 102, e.g., similar to the resistive layer 108 and first conductive layer 110 formed over the first surface 104 of the substrate 102, such that the second conductive layer 112 extends over a portion of the second surface 106.

A pair of terminals 114, 116 can be connected with the capacitor. Each terminal of the pair of terminals can include an electrically conductive material, such as gold, copper, another suitable metal, or other conductive material. In some embodiments, at least one of the first conductive layer 110 or the second conductive layer 112 is one terminal of a pair of terminals. For example, as shown in FIG. 1C, the first conductive layer 110 and the second conductive layer 112 each may form a respective one terminal of a pair of terminals.

In other embodiments, only one of the first conductive layer 110 or the second conductive layer 112 may form one terminal of a pair of terminals, and in still other embodiments, neither the first conductive layer 110 nor the second conductive layer 112 may form a terminal of a pair of terminals. For instance, as shown in FIGS. 1A and 1B, a first terminal 114 of the pair of terminals can be connected with the first conductive layer 110.

Further, the substrate 102 can include a pair of end surfaces 120, 122, and the first terminal 114 can be located closer to one end surface 122 of the pair of end surfaces 120, 122 than the other end surface 120 of the pair of end surfaces 120, 122. For example, the substrate can include a first end surface 120 and a second end surface 122 that are opposite one another along the Y-direction and are perpendicular to the first surface 104 and second surface 106 of the substrate 102. As shown in FIGS. 1A and 1B, the first terminal 114 can be disposed closer to the second end surface 122 than the first end surface 120. In other embodiments, the first terminal 114 can be disposed closer to the first end surface 120 than the second end surface 122. In still other embodiments, the first terminal 114 may be disposed equidistant from the first end surface 120 and the second end surface 122 along the Y-direction.

A second terminal 116 of the pair of terminals can be connected with the substrate 102 or the second conductive layer 112. For example, the capacitor 100 can include the second terminal 116 on the second surface 106 of the substrate 102. As shown in FIG. 1A, the second terminal 116 can be formed from the second conductive layer 112 formed over the second surface 106 of the substrate 102, which is opposite the first surface 104 in the Z-direction. That is, the second conductive layer 112 can be the second terminal 116. Referring to FIG. 1B, in other embodiments, the second terminal 116 can be formed over the second conductive layer 112, such that the second conductive layer 112 is disposed between the second terminal 116 and the substrate 102. The second terminal 116 may be aligned with the first terminal 114 along the Z-direction, as shown in FIG. 1B, or the second terminal 116 may be offset from the first terminal 114 along the Z-direction. For instance, the second terminal 116 may be formed closer to the first end surface 120 than the second end surface 122.

In still other embodiments, each of the second conductive layer 112 and the second terminal 116 can be formed over the second surface 106 of the substrate 102, without the second terminal 116 being formed over the second conductive layer 112, e.g., the second conductive layer 112 can be formed over one portion of the second surface 106 and the second terminal 116 can be formed over another, separate portion of the second surface 106.

In any event, for the capacitor 100, the pair of terminals 114, 116, whether formed separately from the first conductive layer 110 and the second conductive layer 112 or formed by the first conductive layer 110 and/or the second conductive layer 112, are connected to various layers or the substrate 102 of the capacitor 100 such that the capacitor 100 includes a resistor and a capacitor formed in series with one another.

Figure 2A:
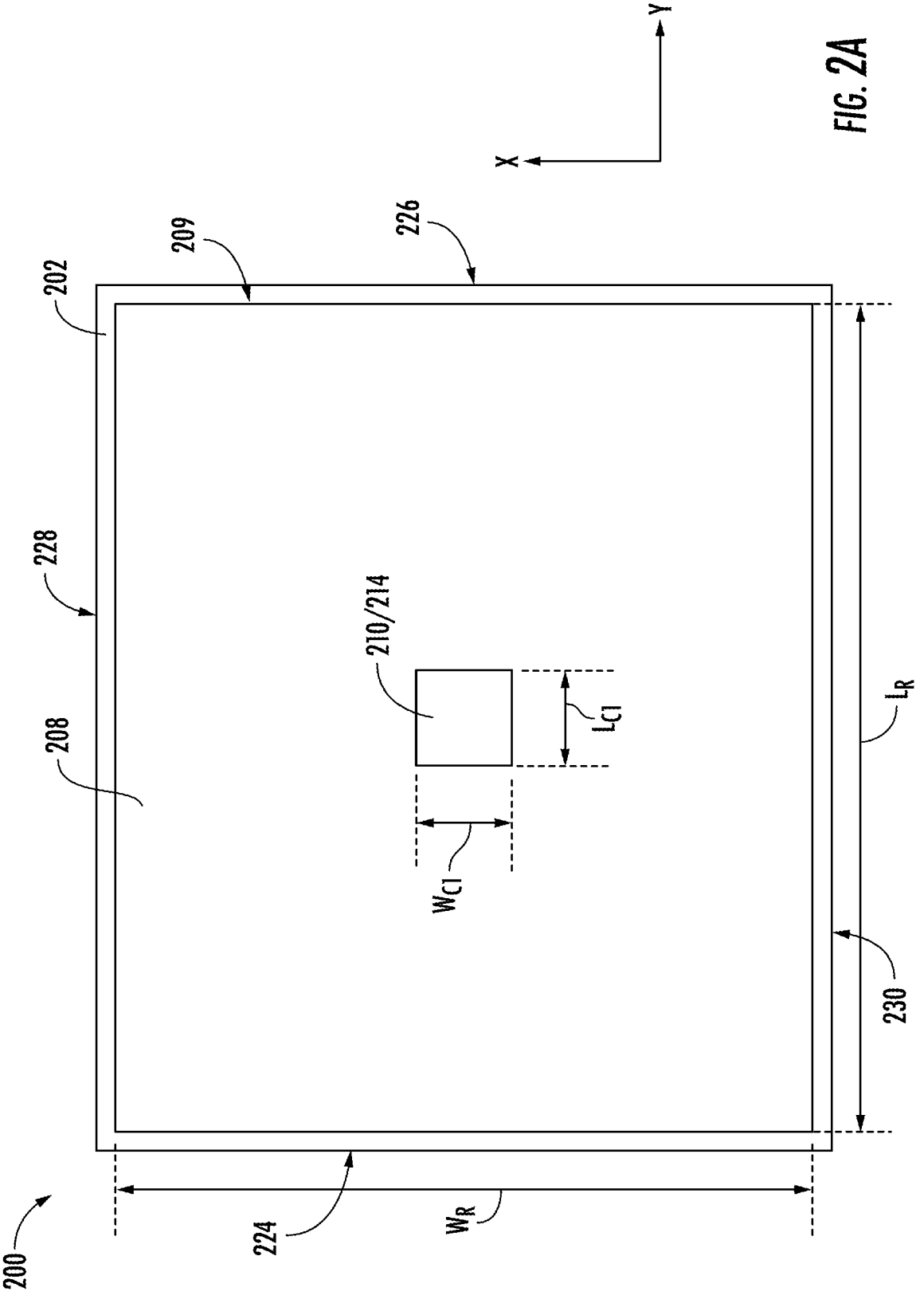
FIG. 2A is a top view of a capacitor according to aspects of the present disclosure.
Figure 2B:
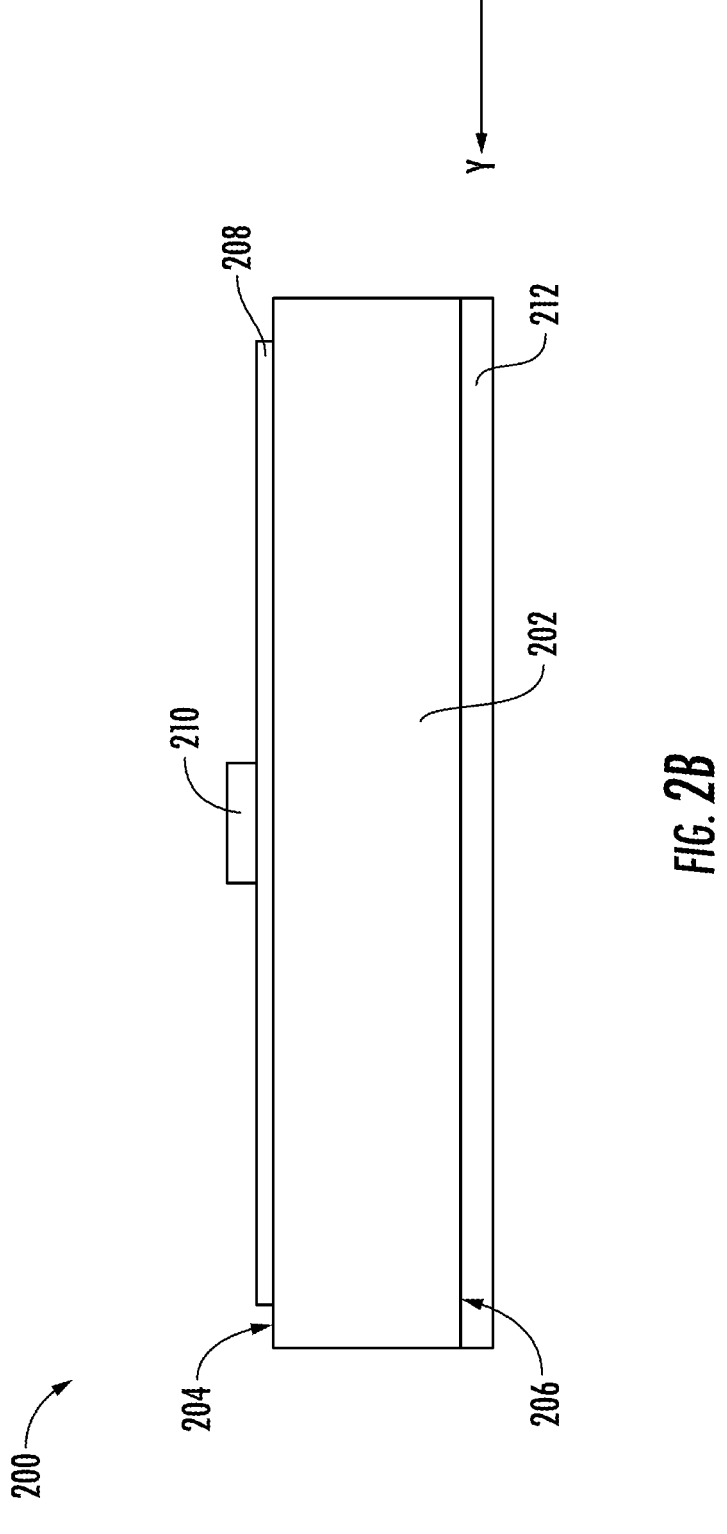
FIG. 2B is a side view of the capacitor of FIG. 2A.

Turning now to FIGS. 2A and 2B, a top view and a side view, respectively, are provided of a capacitor 200 according to aspects of the present disclosure. Similar reference numerals are used in FIGS. 2A and 2B as in FIGS. 1A, 1B, and 1C. For example, the capacitor 200 includes a substrate 202, with a resistive layer 208 formed over at least a portion of a first surface 204 of the substrate 202. A first conductive layer 210 is formed over at least a portion of the resistive layer 208. A second conductive layer 212 is formed over at least a portion of a second surface 206 of the substrate 202, where the second surface 206 is opposite the first surface 204.

In the embodiment of FIGS. 2A and 2B, the first surface 204 is the top surface of the capacitor 200, such that FIG. 2A illustrates the first surface 204. As described with respect to the capacitor 100, the first conductive layer 210 can be contained within a perimeter 209 of the resistive layer 208. In the embodiment illustrated in FIG. 2A, the first conductive layer 210, which in some embodiments can form the first terminal 214, is relatively small compared to the resistive layer 208, which defines the capacitive area. By providing a relatively small first conductive layer 210, only a relatively small area is available for current to flow through, which forces the current through the resistive layer 208.

The relative size of the first conductive layer 210 compared to the resistive layer 208 may be defined by a ratio of an area of the resistive layer 208 to an area of the first conductive layer 210. The area of the resistive layer 208 can be defined by a length $L_R$ of the resistive layer 208 that extends in the Y-direction between a first end edge 224 and a second end edge 226 of the substrate 202 and a width $W_R$ of the resistive layer 208 that extends in the X-direction between a first side edge 228 and a second side edge 230 of the substrate 202. Similarly, the area of the first conductive layer 210 can be defined by a length $L_{C1}$ of the first conductive layer 210 that extends in the Y-direction and a width $W_{C1}$ of the first conductive layer 210 that extends in the X-direction. In some embodiments, the ratio of the area of the resistive layer 208 to the area of the first conductive layer 210 may be within a range of about 100:1, in some embodiments within a range of about 75:1, in some embodiments within a range of about 50:1, in some embodiments within a range of about 25:1, in some embodiments within a range of about 15:1, in some embodiments within a range of about 10:1, in some embodiments within a range of about 5:1, in some embodiments within a range of about 3:1, and in some embodiments within a range of about 1.5:1.

Figure 3:
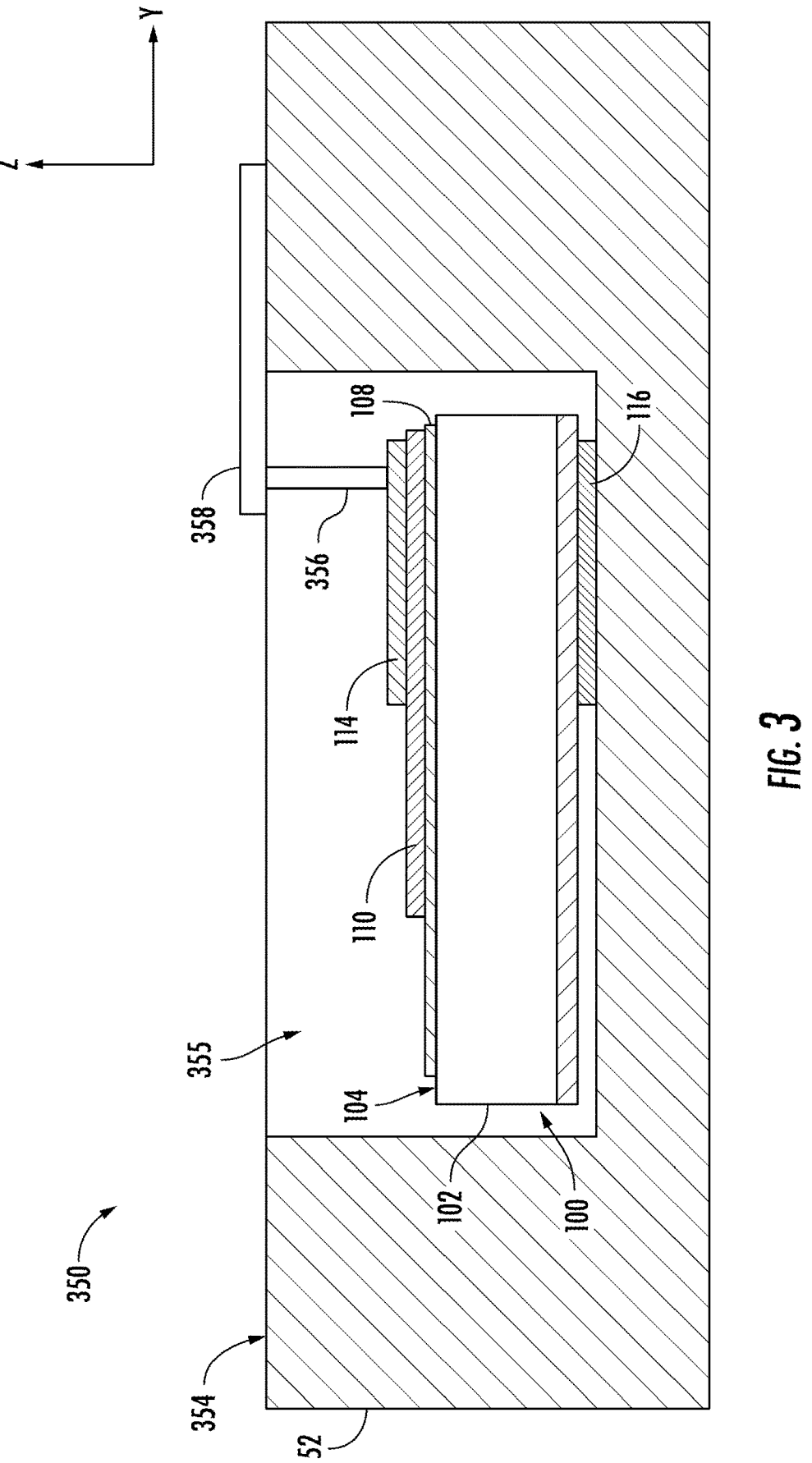
FIG. 3 illustrates an embedded capacitor assembly including a capacitor embedded in a circuit board substrate according to aspects of the present disclosure.

FIG. 3 illustrates an embedded capacitor assembly 350 including a capacitor 100 embedded in a circuit board substrate 352 according to aspects of the present disclosure. The circuit board substrate 352 can be, e.g., a printed circuit board and can be formed from any suitable material such as FR4, polytetrafluoroethylene, or the like. The circuit board substrate 352 includes a mounting surface 354. The capacitor 100, 200 can be at least partially embedded within the circuit board substrate 352 of the assembly 350. For instance, the mounting surface 354 can have an opening 355 that is recessed into the circuit board substrate 352. To minimize its height profile on the board, the capacitor 100 can be embedded within the opening 355 and attached to the circuit board substrate 352 using known techniques. For example, using known techniques, one or more vias can connect one or more terminals of the capacitor 100 with one or more conductive traces of the circuit board substrate 352, as further described herein.

The degree of which the capacitor 100 is embedded depends on a variety of factors, such as the thickness of the circuit board substrate 352, the depth of the opening 355, the thickness of the capacitor 100, etc. The thickness of the circuit board substrate 352 (not including the attached electronic components) may be, in some embodiments, from about 0.1 to about 5 millimeters, in some embodiments, from about 0.2 to about 3 millimeters, and in some embodiments, from about 0.4 to about 1.5 millimeters. Thus, depending on the particular thicknesses employed, the capacitor 100 may be embedded so that the exposed surfaces of the first terminal 114 are substantially coplanar with or below the mounting surface 354 of the circuit board substrate 352. For instance, the capacitor 100 can be embedded and enclosed within the opening 355 of the circuit board substrate 352. Alternatively, the capacitor 100 may be embedded so that the exposed surfaces of the first terminal 114 extend slightly above the mounting surface 354 of the circuit board substrate 352. Regardless, by at least partially embedding the capacitor 100 in the circuit board substrate 352, the height profile or thickness occupied by the capacitor 100 is decreased and may be controlled depending on the desired use.

It should be understood that various other electronic components may also be mounted onto the circuit board substrate 352 as is well known in the art and that a single capacitor 100 is shown only for purposes of illustration. Further, the capacitor 100 shown in FIG. 3 can generally be configured similar to the capacitor 100 of FIGS. 1A-1C, although in other embodiments, the capacitor embedded in the circuit board substrate 352 could be configured similar to the capacitor 200 of FIGS. 2A and 2B.

Referring to FIG. 3, the first terminal 114 and the second terminal 116 are formed over opposite surfaces of the substrate 102 of the illustrated capacitor 100. For example, the first terminal 114 is formed over the first surface 104, which may be an upper surface of the substrate 102, and the second terminal 116 is formed over the second surface 106, which may be a lower surface of the substrate 102. As shown in FIG. 3, a via 356 can extend from the first terminal 114 of the capacitor 100 toward the mounting surface 354 and connect to a conductive layer 358 formed over the mounting surface 354. The via 356 of the embedded capacitor assembly 350 can electrically connect the first terminal 114 with the first conductive layer 358, which may be, e.g., a conductive trace of the circuit board substrate 352. Alternatively, the via 356 can extend toward the mounting surface 354 and connect with one or more intermediate layers (e.g., embedded within the circuit board substrate 352), which can in turn be electrically connected with the conductive layer 358. The via 356 can form at least a portion of an electrical connection between the first terminal 114 of the capacitor 100 and the conductive layer 358 of the embedded capacitor assembly 350. However, it should be understood that, in other embodiments, the terminals 114 can be exposed along the mounting surface 354. In such an embodiment, the embedded capacitor assembly 350 can be free of the via 356.

In some embodiments, the circuit board substrate 352 can include multiple conductive layers 358, e.g., multiple conductive traces, and the capacitor 100 can include multiple terminals 114 exposed along the first surface 104. A plurality of vias 356 can extend from the terminals to the conductive layers of the circuit board substrate 352, e.g., at least one via can extend from a respective one terminal 114 of the capacitor 100 to a respective one conductive layer 358 of the circuit board substrate 352.

Figures 4A, 4B:
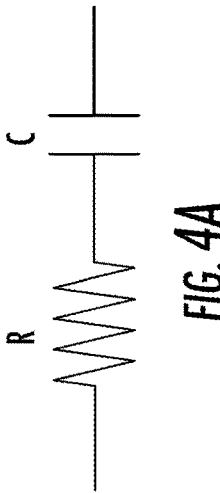
FIG. 4A is an electrical diagram of a capacitor according to aspects of the present disclosure.
FIG. 4B is an electrical diagram of a high electron mobility transistor incorporating a plurality of capacitors according to aspects of the present disclosure.

Turning to FIGS. 4A and 4B, electrical diagrams are provided depicting the capacitors 100, 200 described herein. As shown in FIG. 4A, each capacitor 100, 200 comprises a resistor R and capacitor C arranged in series with one another. Referring to FIG. 4B, one or more of the exemplary capacitors 100, 200 described with respect to FIGS. 1A through 2B may be used in various electrical systems or devices. For example, FIG. 4B illustrates an exemplary high electron mobility transistor (HEMT) according to aspects of the present subject matter. On the left side of the electrical diagram shown in FIG. 4B, a plurality of capacitors as described herein, represented as R6/C18, R5/C10, and R14/C32, are arranged in a negative bias bank, while on the right side, a plurality of capacitors as described herein, represented as R15/C33, R3/C8, and R4/C17, are arranged in a Vdd bias bank. The HEMT represented in FIG. 4B is by way of example only; it will be appreciated that the capacitors 100, 200 described herein may used in a variety of applications.

Figure 5:
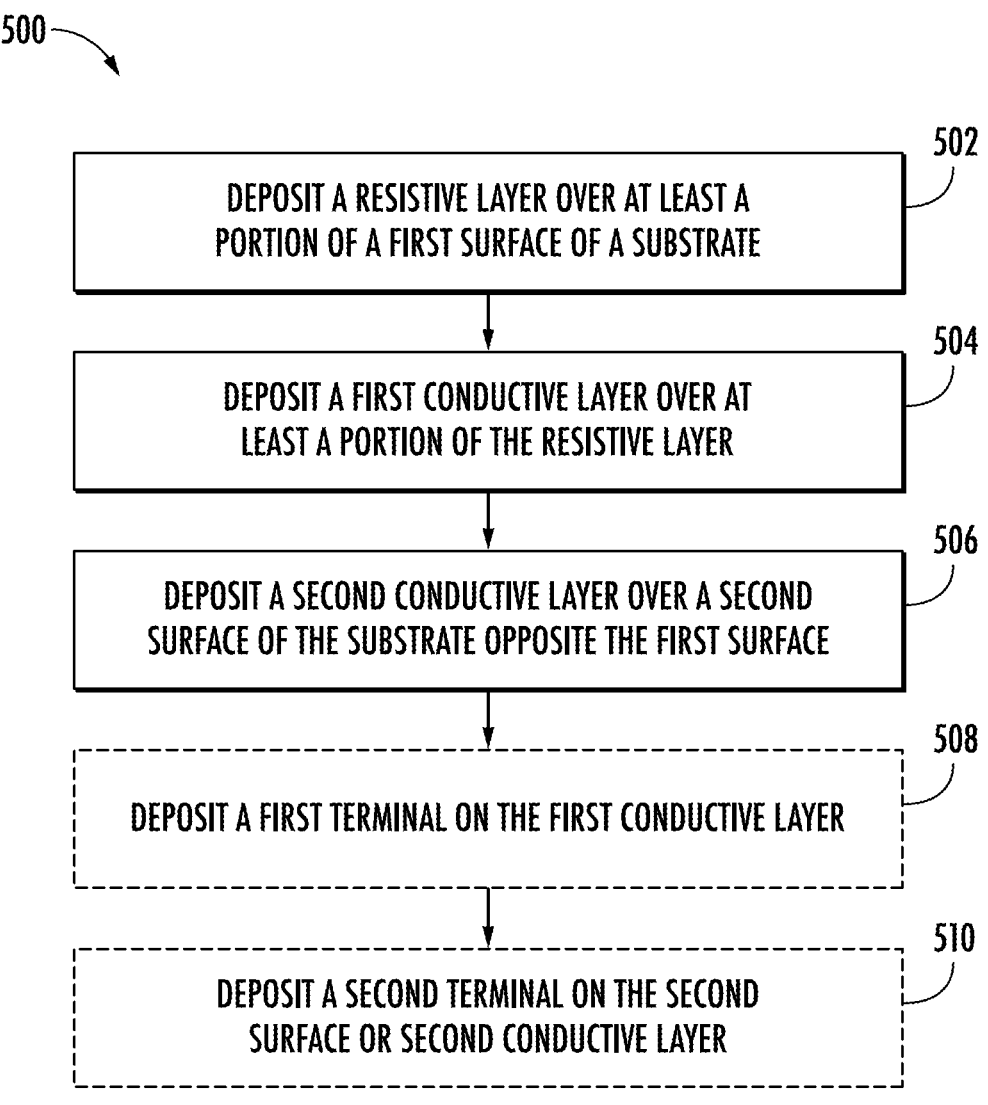
FIG. 5 is a flowchart of a method for forming a capacitor according to aspects of the present disclosure.

Referring now to FIG. 5, aspects of the present subject matter are directed to a method 500 for forming a capacitor such as described herein. In general, the method 500 will be described herein with reference to the capacitor 100 of FIGS. 1A, 1B, and 1C. However, it should be appreciated that the disclosed method 500 may be implemented with any suitable capacitor. In addition, although FIG. 5 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present subject matter.

The method 500 can include (502) depositing a resistive layer 108 over at least a portion of a first surface 104 of a substrate 102 of the capacitor 100. The resistive layer 108 can have a thickness less than about 10 microns. The resistive layer 108 can be formed from tantalum nitride, chromium silicon, or other suitable resistive material such as described herein.

The method 500 can include (504) depositing a first conductive layer 110 over at least a portion of the resistive layer 108. The first conductive layer 110 can be contained within a perimeter of the resistive layer 108. The first conductive layer 110 can be free of direct contact and/or direct electrical connection with the substrate 102.

The method 500 can include (506) depositing a second conductive layer 112 over at least a portion of a second surface 106 of the substrate 102. The second surface 106 of the substrate 102 can be opposite the first surface 104 of the substrate 102.

The method 500 can optionally include (508) depositing a first terminal 114 on the first conductive layer 110. For instance, as described herein, a separate first terminal 114 may be deposited over the first conductive layer 110, or the first conductive layer 110 may form the first terminal 114. The method can optionally include (510) depositing a second terminal 116 such that at least the substrate 102 and the resistive layer 108 are disposed between the first conductive layer 110 and the second terminal 116. For example, as described herein, in some embodiments the second conductive layer 112 may form the second terminal 116. In other embodiments, the second terminal 116 may be deposited on the second conductive layer 112 such that the substrate 102, the resistive layer 108, and the second conductive layer 112 are disposed between the first conductive layer 110 and the second terminal 116. In any event, the pair of terminals 114, 116 are connected to various layers or the substrate of the capacitor 100 such that a resistor and a capacitor are formed in series with one another.

Applications

The capacitor described herein is useful in a variety of applications. For example, the single layer capacitor described herein may be particularly useful in front end preamps, HEMT V-gs, Vdd, hybrid packaged components, and filtering internal packaged semiconductors. Further, the capacitor may be useful in devices that process wideband radiofrequency signals, as the capacitor exhibits excellent performance at high frequencies, such as frequencies of 20 GHz or higher. Example devices include mobile devices (e.g., cell phones, tables etc.), cell phone towers, Receiver Optical Sub Assemblies (ROSA), Transmission Optical Sub Assembly (TOSA), and other RF communication devices. Such RF devices may be particularly useful in military and space applications.

These and other modifications and variations of the present invention may be practiced by those of ordinary skill in the art, without departing from the spirit and scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

What is claimed is:

1. A single layer capacitor comprising:
a substrate having a first surface and a second surface opposite the first surface;
a resistive layer formed over at least a first portion of the first surface of the substrate;
a first conductive layer formed over at least a portion of the resistive layer;
a first terminal formed over at least a portion of the first conductive layer; and
a second conductive layer formed over at least a portion of the second surface of the substrate.

2. The single layer capacitor of claim 1, further comprising:
a second terminal formed over at least a portion of the second conductive layer.

3. The single layer capacitor of claim 1, wherein the resistive layer has a thickness less than about 10 microns.

4. The single layer capacitor of claim 1, wherein the resistive layer is formed from tantalum nitride.

5. The single layer capacitor of claim 1, wherein the resistive layer is formed from chromium silicon.

6. The single layer capacitor of claim 1, further comprising:
a second terminal formed over a second portion of the first surface of the substrate.

7. The single layer capacitor of claim 1, wherein a ratio of an area of the resistive layer to an area of the first conductive layer is at least about 1.5:1.

8. The single layer capacitor of claim 1, wherein a ratio of an area of the resistive layer to an area of the first conductive layer is at least about 10:1.

9. The single layer capacitor of claim 1, wherein a ratio of an area of the resistive layer to an area of the first conductive layer is at least about 20:1.

10. A method for forming a single layer capacitor, the method comprising:
depositing a resistive layer over at least a first portion of a first surface of a substrate;
depositing a first conductive layer over at least a portion of the resistive layer;
depositing a first terminal such that the first terminal is formed over the first conductive layer; and
depositing a second conductive layer over at least a portion of a second surface of the substrate, the second surface opposite the first surface.

11. The method of claim 10, further comprising:
depositing a second terminal such that the second terminal is formed over the second conductive layer.

12. The method of claim 10, further comprising:
depositing a second terminal such that the second terminal is formed over a second portion of the substrate.

13. An embedded capacitor assembly comprising:
a circuit board substrate having a mounting surface; and
a single layer capacitor at least partially embedded within the circuit board substrate, the single layer capacitor comprising:
a substrate having a first surface opposite a second surface,
a resistive layer formed over at least a first portion of the first surface,
a first conductive layer formed over at least a portion of the resistive layer,
a first terminal formed over at least a portion of the first conductive layer, and
a second conductive layer formed over at least a portion of the second surface.

14. The embedded capacitor assembly of claim 13, the single layer capacitor further comprising a second terminal formed over a second portion of the first surface.

15. The embedded capacitor assembly of claim 13, further comprising at least one via connected with the first terminal, the at least one via extending toward the mounting surface of the circuit board substrate.

16. The embedded capacitor assembly of claim 15, wherein the circuit board substrate further comprises a conductive layer, and wherein the at least one via is connected with the conductive layer of the circuit board substrate.

17. The single layer capacitor of claim 2, wherein each of the substrate, the resistive layer, the first conductive layer, the first terminal, the second conductive layer, and the second terminal are stacked along a Z-direction, and wherein the second terminal is offset from the first terminal in a Y-direction that is perpendicular to the Z-direction.

18. The single layer capacitor of claim 1, wherein the first conductive layer is contained within a perimeter of the resistive layer.

19. The single layer capacitor of claim 18, wherein the first conductive layer is centered within the perimeter of the resistive layer.

20. The single layer capacitor of claim 6, wherein the first surface of the substrate extends in a plane defined by an X-direction and a Y-direction, and wherein the second terminal is spaced apart from the resistive layer in at least one of the X-direction or the Y-direction.

\* \* \* \* \*